(12) United States Patent
Sakuma et al.

(10) Patent No.: US 12,147,091 B2
(45) Date of Patent: Nov. 19, 2024

(54) PIEZOELECTRIC DEVICE POWERING SMART CONTACT LENS WITH EYELID MOVEMENT

(71) Applicant: International Business Machines Corporation, Armonk, NY (US)

(72) Inventors: Katsuyuki Sakuma, Fishkill, NY (US); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 17/108,059

(22) Filed: Dec. 1, 2020

(65) Prior Publication Data

US 2022/0171218 A1    Jun. 2, 2022

(51) Int. Cl.
| | |
|---|---|
| *G02C 11/00* | (2006.01) |
| *G02C 7/04* | (2006.01) |
| *H02N 2/18* | (2006.01) |
| *H10N 30/30* | (2023.01) |

(52) U.S. Cl.
CPC ................ *G02C 11/10* (2013.01); *G02C 7/04* (2013.01); *H02N 2/18* (2013.01); *H10N 30/30* (2023.02)

(58) Field of Classification Search
CPC .......... G02C 11/10; G02C 7/04; G02C 11/00; H01L 41/113; H02N 2/18
See application file for complete search history.

(56) References Cited

U.S. PATENT DOCUMENTS

| | | | | |
|---|---|---|---|---|
| 6,010,216 | A * | 1/2000 | Jesiek | H04R 1/1058 |
| | | | | 351/158 |
| 8,482,418 | B1 * | 7/2013 | Harman | A61B 5/4818 |
| | | | | 600/587 |
| 10,568,505 | B2 | 2/2020 | Muniraju | |
| 2005/0127795 | A1 * | 6/2005 | Torii | H01L 41/0815 |
| | | | | 310/360 |
| 2013/0342810 | A1 * | 12/2013 | Nishiwaki | A61B 8/10 |
| | | | | 351/205 |
| 2015/0054621 | A1 * | 2/2015 | Lin | G06K 7/10198 |
| | | | | 235/494 |
| 2016/0097940 | A1 | 4/2016 | Sako | |
| 2017/0042480 | A1 * | 2/2017 | Gandhi | A61B 5/14546 |
| 2017/0354326 | A1 * | 12/2017 | Pugh | A61B 3/10 |
| 2018/0136492 | A1 | 5/2018 | An | |
| 2018/0177393 | A1 * | 6/2018 | Muniraju | A61B 5/6821 |
| 2018/0253632 | A1 * | 9/2018 | Uland | H01L 23/544 |

(Continued)

FOREIGN PATENT DOCUMENTS

| | | |
|---|---|---|
| CN | 103543537 B | 11/2014 |
| CN | 103780143 B | 9/2018 |

(Continued)

*Primary Examiner* — Balram T Parbadia
*Assistant Examiner* — Gabriel A Sanz
(74) *Attorney, Agent, or Firm* — Robert D. Bean

(57) ABSTRACT

An approach to harvesting electrical energy from a user blinking is disclosed. The approach uses an apparatus that includes a piezoelectric film attaching to a user's eyelid, a wire connecting the piezoelectric film to an electronic component; and an antenna surrounding an eye of the user connecting to the electronic component. The approach includes harvesting electrical energy from a user blinking with the piezoelectric film and the antenna wirelessly transmitting the electrical energy to smart contact lens worn by the user.

15 Claims, 8 Drawing Sheets

(56) References Cited

U.S. PATENT DOCUMENTS

| | | | |
|---|---|---|---|
| 2019/0328508 A1* | 10/2019 | Hyde | A61F 2/1654 |
| 2020/0138565 A1* | 5/2020 | Gutierrez | A61F 2/1624 |
| 2020/0383831 A1* | 12/2020 | Houston | G02C 11/00 |
| 2022/0218514 A1* | 7/2022 | Azar | A61B 3/101 |

FOREIGN PATENT DOCUMENTS

| | | | |
|---|---|---|---|
| EP | 3193698 A1 | 7/2017 | |
| WO | 2015035357 A1 | 3/2015 | |
| WO | 2016014118 A1 | 1/2016 | |

* cited by examiner

SIDE VIEW OF
PIEZO ELECTRIC FILM 10
(EYE CLOSED)

SIDE VIEW OF
PIEZO ELECTRIC FILM 10
(EYE OPEN)

PIEZOELECTRIC DEVICE POWERING SMART CONTACT LENS WITH EYELID MOVEMENT

BACKGROUND

The present invention relates generally to the field of smart contact lens, and more particularly to using a piezoelectric sensor to generate power for smart contact lens using eyelid movements.

Smart contact lenses are available today that correct color blindness, that seamlessly transition from light to dark environments, that correct myopia, and even smart contact lenses that slow the progression of nearsightedness in children. Typically, smart contact lenses consist of a pair of soft contact lenses with a number of very thin, biocompatible electronic devices and sensors. Many smart contact lenses include processors and microprocessors to provide the smart contact lenses with some data processing capability. Additionally, most smart contact lens include various types of sensors and antennas for information collection and communication with electronic and computing devices.

SUMMARY

Aspects of an embodiment of the present invention disclose an apparatus, a method, and computer system for harvesting electrical energy from a user blinking. The apparatus includes a piezoelectric film attaching to a user's eyelid, a wire connecting the piezoelectric film to an electronic component; and an antenna surrounding an eye of the user connecting to the electronic component.

DETAILED DESCRIPTION

Figure 1:
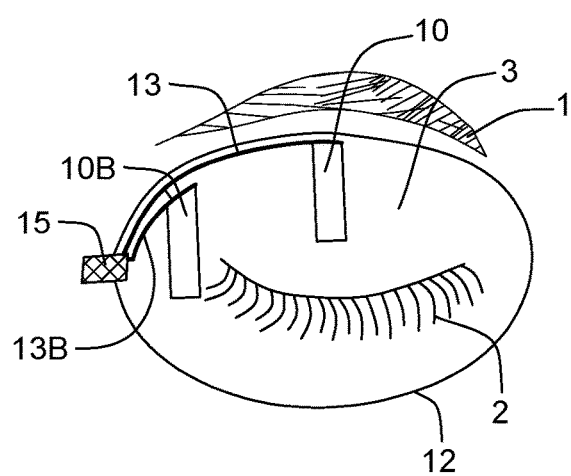
FIG. 1 depicts an illustration of two piezoelectric film locations attached to a user's eyelid when the user's eye is closed, according to an embodiment of the invention.

Embodiments of the present invention recognize that an effective method of powering smart contact lens is needed. Embodiments of the present invention recognize that a number of different methods to power smart contact lenses including very thin batteries, solar cells, and creating a wireless a connection to a wearable power source, such as a battery powered wrist band for a power source to smart contact lens are under development. Embodiments of the present invention recognize that an ability to effectively and efficiently generate power for smart contact lens is desirable. Moreover, embodiments of the present invention recognize that a method using a clean, renewable method of energy generation with biocompatible materials is very desirable. Additionally, embodiments of the present invention recognize that an ability to harvest energy, using piezoelectric films, from involuntary movements, such as blinking, that occur naturally on a regular basis to power smart contact lens would be advantageous.

Embodiments of the present invention recognize that piezoelectric materials generate an electric field when a mechanical force is applied to the piezoelectric material. This phenomenon is known as the piezoelectric effect. Embodiments of the present invention recognize that energy harvesting technology using piezoelectric materials can utilize mechanical energy from various sources, including an involuntary human motion, such as, blinking. Due to their flexibility, piezoelectric composites and piezoelectric polymer films can be used as energy harvesters and nanogenerators. Embodiments of the present invention recognize that some of the properties that make piezoelectric polymers or piezoelectric composites useful for generating energy using blinking include their biocompatibility, biodegradability, and low cost compared to other piezoelectric materials.

Embodiments of the present invention provide an apparatus and a method to harvest mechanical energy from a user blinking into electrical energy provided to smart contact lens worn by the user. Embodiments of the present invention provide a method to generate electrical energy with a piezoelectric film attached to the user's eyelid. The energy is transmitted to an electrical component and an antenna for wireless transmission of the energy to smart contact lens worn by the user. The method utilizes the movement of the user's eyelid during blinking to harvest electrical energy generated by the piezoelectric film using the piezoelectric effect provided by the crystal structure of the piezoelectric material. A wire attached to the piezoelectric film provides the harvested electrical energy to a component that provides an ability to wirelessly transmit the energy to the smart contact lens using an antenna. The component that is electrically connected to the antenna includes, at least, a circuit capable of generating a method of energy transmission, such as, by a radio frequency signal or by near-field communication, to smart contact lens. The smart contact lens include an antenna capable of receiving the wirelessly transmitted energy from the component.

Embodiments of the present invention provide a piezoelectric film attached to the user's eyelid that connects to a wire. The wire electrically connects the piezoelectric film to a component which, in turn, is electrically connected to the antenna for a wireless energy transmission or an energy transfer using near-field communication to the smart contact lens. In this way, embodiments of the present invention generate electrical energy from blinking to smart contact lens in the blinking eye. The wireless transmission of the energy generated by the piezoelectric film during a user's blinking action occurs using known methods of wireless power transfer (WPT), also known as wireless energy transmission (WET). In the wireless energy transfer, a component, electrically connected to the piezoelectric film that harvests the electrical energy from blinking, uses near-field wireless transmission to transfer the harvested energy over a short distance to smart contact lens worn by the user. The electrical energy may be transferred by magnetic fields using inductive coupling between coils of wire or antennas connecting to each of the transmitting component connected to the piezoelectric film and the receiving component in the smart contact lens.

Embodiments of the present invention provide a method to generate electrical energy with a piezoelectric film on the user's eyelid that is transmitted to an electrical component with an ultrasonic transmitter for transmission of the energy through the user's eyelid and eye to the smart contact lens using ultrasonic waves.

Detailed embodiments of the claimed structures and methods are disclosed herein. The method steps described below do not form a complete process flow for manufacturing integrated circuits, such as, piezoelectric devices and piezoelectric films. The present embodiments can be practiced in conjunction with the integrated circuit fabrication techniques currently used in the art, and only so much of the commonly practiced process steps are included as are necessary for an understanding of the described embodiments. The figures represent cross-section portions of a piezoelectric devices and smart contact lens after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

The figures provide only illustrations of various implementations of the present invention and does not imply any limitations with regard to the environments in which different embodiments may be implemented. Implementation of embodiments of the invention may take a variety of forms, and exemplary implementation details are discussed subsequently with reference to the Figures. Many modifications to the depicted environment may be made by those skilled in the art without departing from the scope of the invention as recited by the claims.

FIG. 1 depicts an illustration of piezoelectric film 10 and 10B that are attached to a person's or a user's eyelid when the user's eye is closed, according to an embodiment of the present invention. When a user involuntarily blinks, as commonly occurs when the user is awake, the user's eye will temporarily close (as depicted) for a very brief time before re-opening, As depicted, FIG. 1 the closed eye of the user that includes eyebrow 1, eyelashes 2, eyelid 3, piezoelectric film 10 on the center of eyelid 3, piezoelectric film 10B located on an outside corner of the user's eyelid 3, antenna 12, wire 13, wire 13B, and component 15. While the locations of piezoelectric film 10 and 10B are depicted as the center of the user's eyelid 3 and the outer corner of the user's eyelid 3, the location of piezoelectric film 10 and 10B are not limited to these locations on the user's eyelid. For example, piezoelectric film 10B can reside in the inside corner of the eyelid 3 of the user adjacent to the user's nose (not depicted). In some embodiments, the location of piezoelectric film 10 and 10B is defined by the user. In some embodiments, the user places piezoelectric film 10 or 10B anywhere on eyelid 3. The location of piezoelectric film 10 or 10B can be any location on the user's eyelid 3 that induces a sufficient strain in piezoelectric film 10 and/or 10B to generate electrical energy when piezoelectric film 10 and/or 10B moves during blinking of the user's eye. The deformation or flexing of piezoelectric film 10 and/or 10B when eyelid 3 moves during blinking creates a strain in piezoelectric film 10 and 10B that generates electrical energy in piezoelectric film 10. For example, when eyelid 3 moves as the user opens eye 4 then, the location of piezoelectric film 10 and 10B should be such that piezoelectric film 10 and 10B bends enough to generate electricity or a voltage sufficient for harvesting or transmitting over wire 13 and 13B, respectively, to component 15.

While FIG. 1 depicts two portions of piezoelectric films (e.g., piezoelectric film 10 and 10B), in other embodiments, a different number of piezoelectric films are attached to the user's eyelid. For example, only piezoelectric film 10 may be present in some embodiments. In an embodiment, three piezoelectric films similar to piezoelectric film 10 and 10B are attached to the user's eyelid 3.

In various embodiments, piezoelectric film 10 and piezoelectric film 10B are a flexible piezoelectric film for energy harvesting. In various embodiments, piezoelectric film 10 and 10B are biocompatible. As known to one skilled in the art, the piezoelectric effect can convert the kinetic energy of the user blinking their eye 4 into electrical energy. The blinking of the user's eye 4 and eyelid 3 creates strain and stress in the piezoelectric film 10 and 10B as piezoelectric film 10 and 10B flexes and stretches during blinking.

Piezoelectric film 10 and 10B can be composed of any known piezoelectric material capable of being produced in a flexible strip of a size suitable for placement on a human eyelid. For example, piezoelectric film 10 and 10B are one of a piezoelectric composite or a piezoelectric polymer film. In various embodiments, piezoelectric film 10 and 10B are composed of a polymer piezoelectric film, such as, a polyvinylidene fluoride (PVDF). PVDF is a semi-crystalline polymer which is synthesized by the polymerization of $CH_2$—$CF_2$ monomers. PVDF can be a non-toxic, highly stable film with both a high dielectric constant and a high piezoelectric constant. However, piezoelectric film 10 and 10B is not limited to this material but, may be composed of another flexible piezoelectric material or a flexible material coated with one or more layers of a piezoelectric material film. For example, piezoelectric film 10 and 10B can be composed of a polyimide film with a graphene coating on one or both sides of piezoelectric film 10 and 10B.

In various embodiments, piezoelectric film 10 and 10B includes one or more electrodes for an electrical connection to wire 13 and wire 13B, respectively. The electrodes may be composed of a metal material, such as, copper, copper-nickel, silver, gold, a metal alloy or another suitable electrically conductive material. As depicted, wire 13 connects piezoelectric film 10 to component 15 and wire 13B connects piezoelectric film 10B to component 15. In one embodiment, piezoelectric film 10 and 10B can be electrically connected to wire 13 and 13B respectively which in turn, electrically connects to component 15. Wire 13 and wire 13B may be composed of gold, silver, copper, another electrically conductive metal, or an alloy of one or more electrically conductive metals. In an embodiment, wire 13 and 13B are encapsulated in a biocompatible material and may be attached to eyelid 3 by a biocompatible adhesive.

In one embodiment, piezoelectric film 10 and 10B are not biocompatible but have a biocompatible film underneath piezoelectric film 10 and 10B. In an embodiment, piezoelectric film 10 and 10B include a biocompatible adhesive under piezoelectric film 10 and 10B which contacts the user's eyelid 3. A typical size of piezoelectric film 10 and 10B could be 1-28 mm wide by 1-15 mm long with a range of thickness from 0.1 um to 1500 um thick but, piezoelectric film 10 and 10B are not limited to these sizes. In some embodiments, the thickness of piezoelectric film 10 and 10B is dependent, at least in part, on the piezoelectric material used. The thickness of piezoelectric film 10 and 10B may be greater when an adhesive layer is present on a backside of the film. In other examples, piezoelectric film 10 and 10B might be smaller in size when multiple piezoelectric film 10 and 10B are on eyelid 3 or larger when only one of piezoelectric film 10 or 10B is present. Piezoelectric film 10 and 10B may have the same size or a different size.

Antenna 12 can be composed of any known material used for radio frequency (RF) signal transmission, near-field communication (NFC) or other method of wireless communication or transmission of the energy harvested by piezoelectric film 10 and 10B to smart contact lens worn by the user. As depicted in FIG. 1, antenna 12 is attached to eyelid 3 (e.g., to the skin of eyelid 3 of the user) and around the eye of the user. In other words, antenna 12 surrounds the eye of the user (e.g., as an oval or a circle around the user's eye). In various embodiments, antenna 12 is electrically and mechanically connected to wire 13 and component 15. The electrical connections to antenna 12 can be one of a soldered connection (e.g., using a tin-silver solder, tin-silver-copper solder), a gold-to-gold connection, a wirebond connection, a flip chip connection, a brazed connection, or a conductive adhesive connection (e.g., a silver-filled epoxy, a gold-filled adhesive, a copper or graphene filled adhesive) to wire 13 and component 15.

In various embodiments, antenna 12 is composed an electrically conducting material. For example, antenna 12 can be composed of a very small gauge wire, a small flat wire tape, or a conductive trace, such as, a conductive ink on a paper or polymer carrier where the conductive material may be a copper material, a silver material, a gold material, another metal material, an alloy that is a combination of one or more metal materials, or maybe a metal material combined with a polymer material but, is not limited to one of these materials. In some embodiments, antenna 12 is coated or encapsulated with a biocompatible material. In some cases, the non-electrically conductive coating on antenna 12 may be tinted. In some embodiments, antenna 12 includes a bottom adhesive layer. For example, antenna 12 maybe a coiled, flattened, small gauge silver wire with a colored coating on the topside and a biocompatible adhesive covered with a peel-away protective bottom layer (e.g., like an adhesive bandage) for attachment to the user's eye area as depicted. In another example, antenna 12 may be attached, as depicted, to the eye area using a biocompatible liquid adhesive (e.g., an adhesive used to attach false eyelashes). Another example for forming antenna 12 using a conductive ink is discussed later in detail with respect to FIG. 6.

Antenna 12 may include a single coil as depicted in FIG. 1 or multiple coils of an electrically conductive material or metal wires. In various embodiments, antenna 12 is composed of an electrically conductive material forming one or multiple co-centric circles or co-centric ovals surrounding eye 4 of the user wearing smart contact lens. The number of coils of antenna 12 may be determined by the materials used for the electrically conductive material of antenna 12 and/or the amount of energy to be transmitted to smart contact lens 5. In various embodiments, antenna 12 transmits energy generated by piezoelectric film 10 and 10B to smart contact lens worn by the user.

In various embodiments, component 15 is a small module or device capable of receiving the energy generated by piezoelectric film 10 and 10B when the user blinks their eyes and using antenna 12 to transmit the electrical energy generated by piezoelectric film 10 and/or 10B to smart contact lens (not depicted in FIG. 1) in the eye of the user. Component 15 is an electronic component that can be a single chip module, a multi-chip module, a surface mount device, a semiconductor chip, or a flexible component with one or more electrical devices, semiconductor chips, or circuits. In some embodiments, component 15 is a microelectromechanical system (MEMS) or a MEMS device. As known to one skilled in the art, MEMS devices can be used in micro-scale energy harvesting using piezoelectric sensors or films, such as, piezoelectric film 10 and 10B. In one embodiment, component 15 uses nanoelectromechanical system (NEMS) or a NEMS device. In various embodiments, component 15 includes one or more of the elements of computer system 1300 depicted in FIG. 13.

In various embodiments, component 15 receives energy from piezoelectric film 10 and 10B and provides the energy to antenna 12 for wireless transmission to smart contact lens (not depicted in FIG. 1) worn by the user. For example, component 15 can receive, over wire 13, a voltage or electrical energy generated by piezoelectric film 10 and 10B. In some cases, component 15 converts the voltage to an electrical current (e.g., an alternating current (AC) and/or a direct current (DC)) that is sent by a wireless transmitter, for example using NFC, to receiving antenna in the smart contact lens worn by the user. Component 15 may include one or more of a wireless transmitter, such as an NFC transmitter, a micro controller, an embedded processor, and/or a driver. In various embodiments, component 15 electrically connects to wire 13 and antenna 12. Component 15 can be mechanically connected to antenna 15. In some embodiments, component 15 connects mechanically to the user's eyelid 3 or to a corner of the user's eye.

In various embodiments, component 15 is encapsulated with a biocompatible material. In some embodiments, the encapsulation of component 15 is tinted. Component 15 can be covered with a molded material in a leadframe attached by surface mount technology (SMT) to antenna 12 and wire 13. Component 15 can be an encapsulated die (e.g., a semiconductor die wirebonded or flip chip bonded to antenna 12 and wire 13 then, encapsulated), one or more electrical components or semiconductor chips attached to a flexible film (e.g., a circuitized polyimide film), or another known semiconductor package type. Component 15 electrically connects to both wire 13 and antenna 12 using known connection methods, such as, solder, gold-to-gold, wire bond, flip chip, brazing, or with an electrically conductive adhesive.

Figure 2:
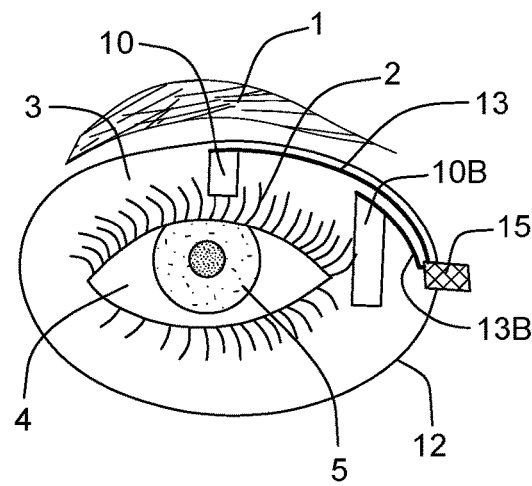
FIG. 2 is an illustration of two piezoelectric film locations in a piezoelectric device attached to a user's eyelid when the user's eye is open, according to an embodiment of the present invention.

FIG. 2 is an illustration of piezoelectric film 10 and 10B on eyelid 3 when eye 4 is open, according to an embodiment of the present invention. As depicted, FIG. 2 includes eyebrow 1, eyelashes 2, eyelid 3, eye 4 with smart contact lens 5, piezoelectric film 10 and 10B, antenna 12, and component 15. The elements and components of FIG. 2, except for smart contact lens 5, are essentially the same as the components described above with reference to FIG. 1.

Smart contact lens 5, while not distinctly visible in FIG. 2, is over a portion of the user's eye (e.g., over the iris and pupil of eye 4). A detailed description of smart contact lens 5 occurs later with respect to FIG. 8. As known to one skilled in the art, smart contact lens 5 is a computing device including at least sensors, an antenna, and one or more processors or microprocessors. In various embodiments, smart contact lens 5 are a wearable computer, such as, computer system 1300 depicted in FIG. 13.

Figure 3:
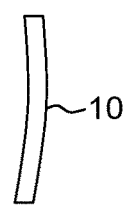
FIG. 3 is an illustration of a cross-sectional view of a piezoelectric film attached to the user's eyelid when the user's eye is closed, according to an embodiment of the present invention.
Figure 4:
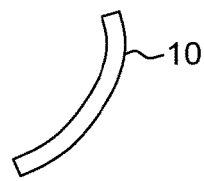
FIG. 4 is an illustration of a cross-sectional view of a piezoelectric film attached to the user's eyelid when the user's eye is open, according to an embodiment of the present invention.

As depicted in FIG. 2, when the user closes and re-opens eye 4 during a blinking motion, piezoelectric film 10 and 10B are flexed as depicted in FIG. 4. The blinking movement of the user's eye 4 causes movement of eyelid 3 which in turn, generates energy in piezoelectric film 10 and 10B that is captured by antenna 12. FIGS. 3 and 4, respectively, depict representative cross-sections of piezoelectric film 10 when eye 4 is closed and open. As discussed in detail above with respect to FIG. 1, in various embodiments, antenna 12 using component 15 transmits the electrical power harvested by piezoelectric film 10 and 10B wirelessly to smart contact lens 5.

FIG. 3 is an illustration of a cross-sectional view of piezoelectric film 10 attached to the user's eyelid 3 when the user's eye is closed, according to an embodiment of the present invention. As depicted, FIG. 3 is a cross-section of piezoelectric film 10 in FIG. 1 when the user's eyelid 3 is down and eye 4 is shut. FIG. 3 depicts a cross-section of piezoelectric film 10 looking at a side of piezoelectric film 10 from the bridge of the user's nose (e.g., looking at the edge or cross-section of piezoelectric film 10 in FIG. 1 from the right side of the paper). As depicted, when the user closes their eyes, for example to blink, eyelid 3 is pulled down and piezoelectric film 10 is pulled into a straightened position or strained position. When eyelid 3 is closed, piezoelectric film 10 is stretched during a blink of the user's eye 4. In this case, piezoelectric film 10 can be strained generating electrical energy (e.g., a voltage) in piezoelectric film 10.

FIG. 4 is an illustration of a cross-sectional view of piezoelectric film 10 attached to the user's eyelid 3 when the user's eye 4 is open, according to an embodiment of the present invention. As depicted, FIG. 4 is a cross-section looking at a side of piezoelectric film 10 in FIG. 2 from the bridge of the user's nose (e.g., looking at the edge or cross-section of piezoelectric film 10 from the right side of the paper) when the user's eyelid 3 is up and eye 4 is open. In this case, piezoelectric film 10 may be bent as depicted in FIG. 4. When piezoelectric film 10 is flexed as depicted in FIG. 4 then, electrical energy can be generated by the movement of piezoelectric film 10. For example, during a flexing motion of piezoelectric film 10, an outer portion of the curved surface piezoelectric film 10 can be strained and an inside portion of the curved piezoelectric film 10 can be stressed. In this case, the movement of piezoelectric film 10 can generate electrical energy as eye 4 opens.

Figure 5:
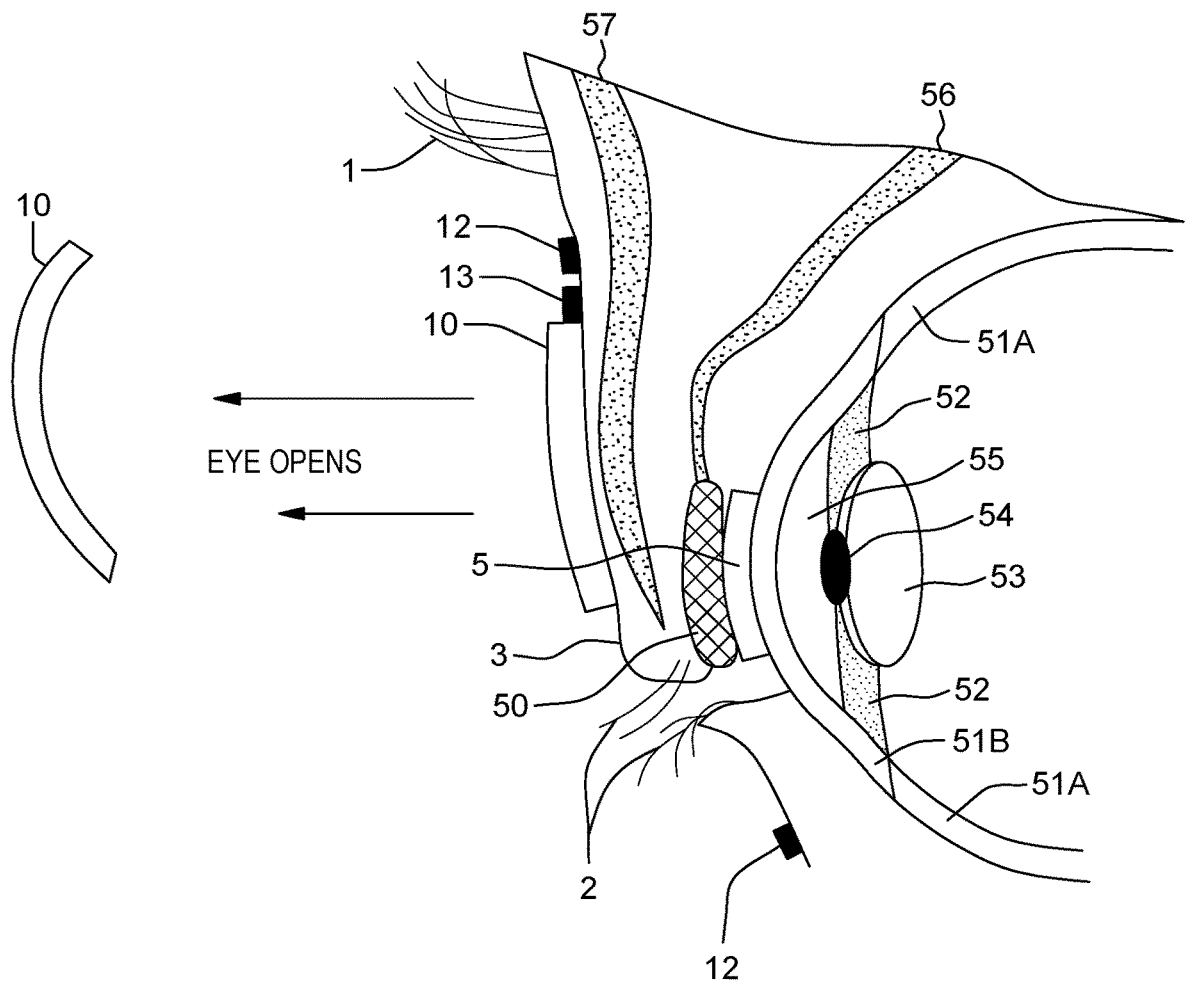
FIG. 5 is a detailed illustration of a cross-sectional view of the user's eye with a smart contact lens and the piezoelectric film when the user's eye is closed, according to an embodiment of the present invention.

FIG. 5 is a detailed illustration of a cross-sectional view of the user's eye with smart contact lens 5 and the piezoelectric film 10 when the user's eye is closed, according to an embodiment of the present invention. As depicted, FIG. 5 includes eyebrow 1, eyelashes 2, eyelid 3, smart contact lens 5, piezoelectric film 10, wire 13, antenna 12, tarsus 50, sclera 51A, cornea 51B, iris 52, lens 53, pupil 54, aqueous humour 55, levator palpebrae superioris muscle 56, and orbicularis oculi muscle 57. FIG. 5 depicts a cross-section through smart contact lens 5 and piezoelectric film 10 some of the anatomical features of the user's eye area. Cornea 51, iris 52, lens 53, pupil 54, and aqueous humour 55 are some of the elements composing eye 4 in FIG. 2. With eyelid 3 closed, piezoelectric film 10 is pulled down (e.g., strained) as eyelid 3 is closed during the blinking motion of the user. When eyelid 3 lifts to expose smart contact lens 5 on cornea 51 and pupil 54 of lens 53, piezoelectric film 10 will be flexed. The blinking movement of eyelid 3 driven, as least in part, by orbicularis oculi muscle 57 and levator palpebrae muscle 56 moves piezoelectric film 10 (e.g., flexing and stretching of piezoelectric film 10 during blinking) to generate electrical energy using the piezoelectric effect. Wire 13 connected to piezoelectric film 10 can carry the generated electrical energy to component 15 (not depicted in FIG. 5). In some embodiments, component 15 converts a voltage generated by piezoelectric film 10 to an electrical signal or energy and sends the electrical signal to antenna 12. Antenna 12 depicted above wire 13 and piezoelectric film 10 and below the bottom eye lashes 2, surrounds the eye area and can be used to wirelessly transmit the harvested electrical energy generated by the user blinking to smart contact lens 5. In some cases, antenna 12 uses NFC to transmit the harvested electrical energy to receiving antennas in smart contact lens 5.

Figure 6:
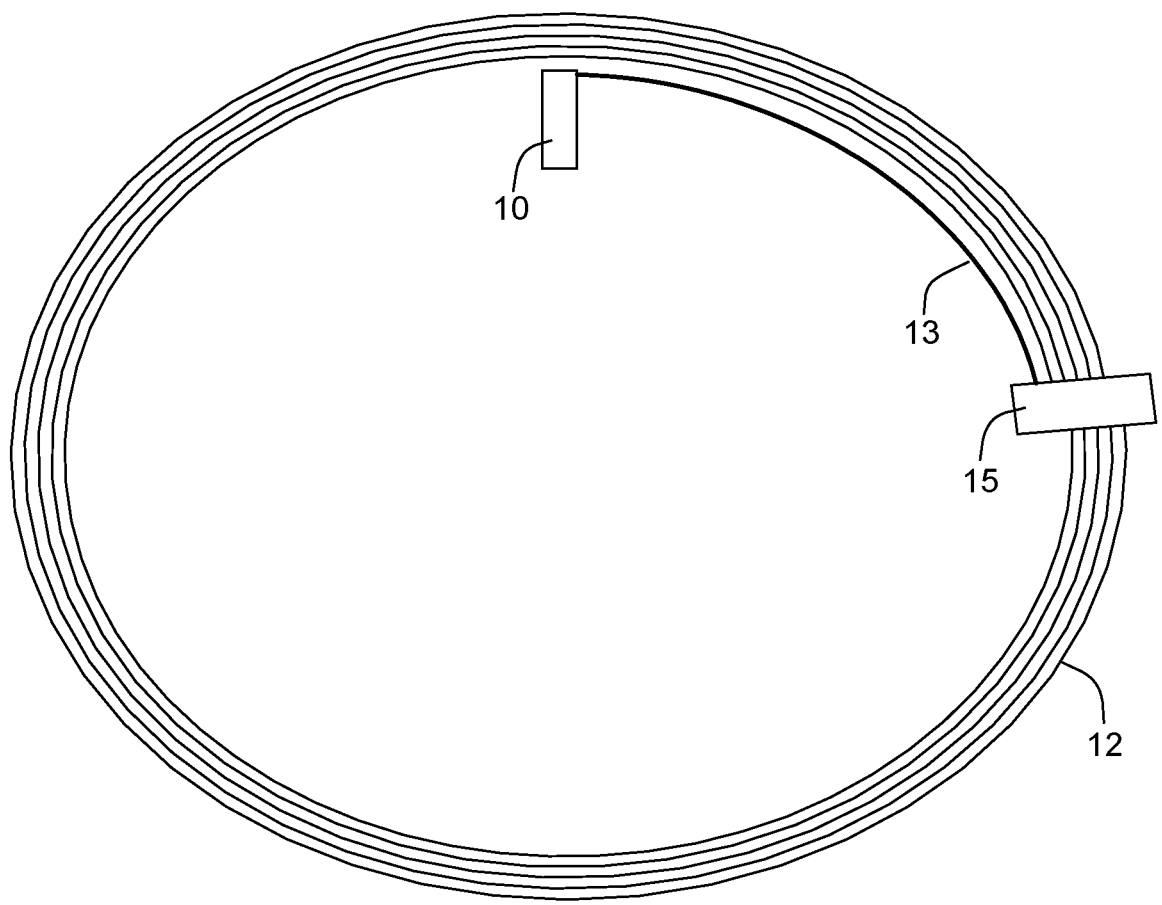
FIG. 6 is an illustration of an antenna for wirelessly transmitting the harvested electrical energy to smart contact lens worn by the user, according to an embodiment of the present invention.

FIG. 6 is an illustration of antenna 12 for wirelessly transmitting the harvested electrical energy to smart contact lens worn by the user, according to an embodiment of the present invention. FIG. 6 depicts one example of antenna 12. As previously discussed in detail with respect to FIG. 1, in other examples, antenna 12 can be a wire, a number of coils of a wire in a biocompatible plastic coating or tape, or another biocompatible form of an antenna for wireless transmission of electrical energy.

As depicted in FIG. 6, antenna 12 includes piezoelectric film 10 and component 15 connected to antenna 12 by wire 13. As previously discussed, component 15 and piezoelectric film 10 and 10B can be electrically connected to wire 13 by one or more of solder, gold-to-gold, wire bonds, flip chip, electrically conductive adhesive, such as a silver, copper, or gold-filled epoxy or silicon adhesive. Similarly, wire 13 can be electrically connected to antenna 12 by a solder connection, gold-to-gold connection, a wirebond connection, a braze connection, or a conductive adhesive connection. In various embodiments, the connections to piezoelectric film 10 and 10B, to wire 13, and to antenna 12 are encapsulated. In some cases, component 15 may also be mechanically connected to a top surface of antenna 12 by an adhesive, such as a non-electrically conductive epoxy.

In various embodiments, antenna 12 is an antenna coil composed of inkjet printed and laser sintered circuit lines (e.g., coils) and contact pads. For example, silver nanoparticle containing inks can be inkjet printed on a paper substrate and selectively laser sintered to form antenna 12. In some embodiments, antenna 12 includes a biocompatible adhesive layer attaching to the user's skin around each eye of the user. In one embodiment, the bottom portion of antenna 12 is attached to the user's skin around the eye using a biocompatible, dispensable liquid adhesive (e.g., an adhesive for attaching false eyelashes). Antenna 12 is not limited to these materials or methods of formation but, can be formed with other known methods on a flexible material. For example, in another embodiment, antenna 12 is formed with selectively deposited conductive lines (e.g., copper or copper with nickel and/or gold protective plating) on a polyimide film to form contact pads and the coils or lines of antenna 12. While antenna 12 is depicted with four co-centric rings or ovals forming antenna 12, in other embodiments, antenna 12 may have more or less co-centric rings. The number of rings or coils in antenna 12 may be determined based, at least in part, on the conductivity of the material forming the coils, the amount of electrical energy to be transmitted by antenna 12, the antenna in smart contact lens 5 receiving the wireless transmission, a distance to the receiving antenna, etc.

Figure 7A:
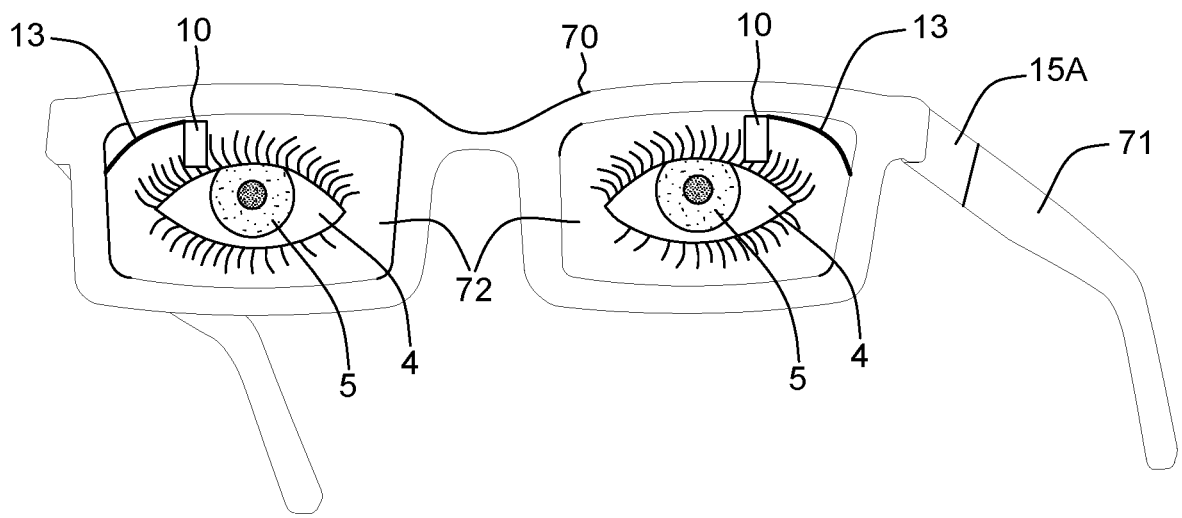
FIG. 7A depicts an illustration of a front view of the user wearing a pair of glasses with an electrical component attached to a wire, according to an embodiment of the invention.

FIG. 7A depicts an illustration of a front view of the user wearing a pair of glasses with component 15, according to an embodiment of the invention. As depicted, FIG. 7A includes a front view of a pair of eyeglasses composed of frame 70, lens 72, and temple 71 with wire 13 attached to antenna 12 (not depicted in FIG. 7A) behind frame 70, wire 13, piezoelectric film 10 on eyelid 3, eye 4, smart contact lens 5 in eye 4. Wire 13 attaches to piezoelectric film 10 and to component 15A (not depicted in FIG. 7A). In some embodiments, component 15A is on frame 70, adjacent to a connection of frame 70 and temple 71 by a hinge (not depicted). One or more of component 15A may be present on frame 70 or temple 71. Component 15A is essentially the same as component 15, except for the location of component 15A (e.g., component 15A provides the same function as component 15 in FIG. 1). In some embodiments, component 15A includes additional processors, embedded processors, memory devices or other semiconductor and electrical components (e.g., capacitors, resistors, etc.). In some embodiments, component 15A includes one or more of the elements of computer system 1300 depicted in FIG. 13.

As depicted, wire 13 on eyelid 3 connects piezoelectric film 10 to component 15A. Not depicted in FIG. 7A is a connection of component 15A to antenna 12. In this example, antenna 12 (not depicted) can be on the backside of frame 70. In this example, piezoelectric film 10 generates electrical energy when eye 4 blinks (e.g., eyelid 3 closes and re-opens) that is carried by wire 13 to component 15A, which, in turn, transmits the electrical energy to antenna 12 (depicted in FIG. 7B) for wireless transmission to smart contact lens 5 in eye 4. In one embodiment, frame 70 is a wired frame with a plastic (e.g., non-electrically conductive) nose piece between two-wired frames 70 each holding one of lens 72. Wire 13 connected to each of piezoelectric film 10 on the user's eyelid 3 also connects to the adjacent wire frame 70. In this embodiment, the two wired frames 70, each surrounding one of lens 72, acts as an antenna (e.g., performs the function of antenna 12 which is not needed or is not attached to the back of frame 70 or is not attached to the user's skin around the user's eye 4 in this embodiment).

Figure 7B:
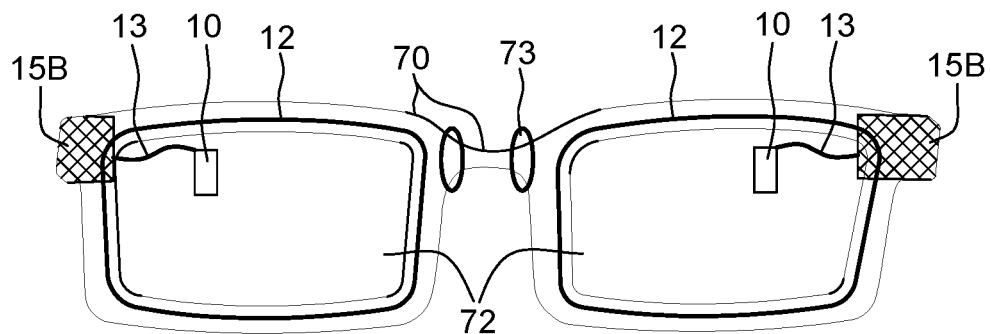
FIG. 7B depicts an illustration of a back view of the glasses with the antenna and an electrical component, according to an embodiment of the present invention.

FIG. 7B depicts an illustration of a back view of the glasses with antenna 12 and component 15B, according to an embodiment of the present invention. As depicted, FIG. 7B includes a back view of a pair of glasses composed of frame 70, lens 72, and nose guards 73, piezoelectric film 10, wire 13, component 15B, and antenna 12. Temple 71 that holds frame 70 on the user's ears is not depicted in FIG. 7B. In various embodiments, piezoelectric film 10 creates electrical energy when the user blinks eye 4 (depicted in FIG. 7A) that is transmitted over wire 13 to component 15B attached to antenna 12. In this case, component 15B may convert received electrical energy generated by piezoelectric film 10 to electrical energy that may be wirelessly transmitted by antenna 12 to smart contact lens 5 (depicted in FIG. 7A). While FIG. 7B depicts component 15B connected to wire 13, in other embodiments, wire 13 connects to component 15A. One or more of component 15A or component 15B may be present on frame 70 or temple 71. Component 15B, like component 15A, may provide additional computing capability or storage (e.g., memory). Component 15B may include more processors, memory devices, and other electrical components not included in component 15. An ability to mount components 15A and 15B on frame 70 can provide additional space for additional electrical and/or semiconductor devices in components 15A and 15B.

Figure 7C:
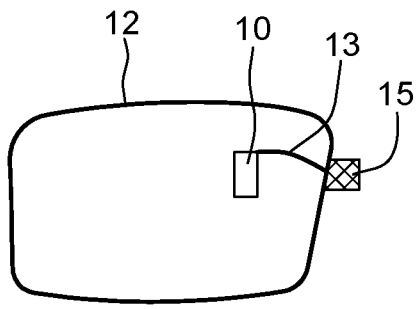
FIG. 7C depicts an illustration of an attachable piezoelectric device, according to an embodiment of the present invention.

FIG. 7C depicts an illustration of attachable piezoelectric device, according to an embodiment of the present invention. As depicted, the attachable piezoelectric device includes piezoelectric film 10 connected by wire 13 to component 15, and antenna 12 connecting to component 15. In this embodiment, attachable piezoelectric device provides the functionality of the glasses in FIGS. 7A and 7B. The attachable piezoelectric device can be a disposable piezoelectric device for transmitting electrical energy generated by piezoelectric film 10 after a user attaches or places the attachable piezoelectric device on eyelid 3 of the user. In this embodiment, the user peels away a removable peel-away cover (not depicted) on the backside of piezoelectric film 10 to expose the adhesive layer and may at the same time, peel away the removable cover on the backside of antenna 12 and component 15. The user may place or adhere the backside of piezoelectric film 10 to their eyelid 3 and antenna 12 around the user's eye and component 15 in a corner of the user's eye as depicted in FIG. 1. At any time, the user may remove and/or remove and replace the attachable piezoelectric device by gently pulling antenna 12 and piezoelectric film 10 from eyelid 3 and the area around eye 4.

Figure 8:
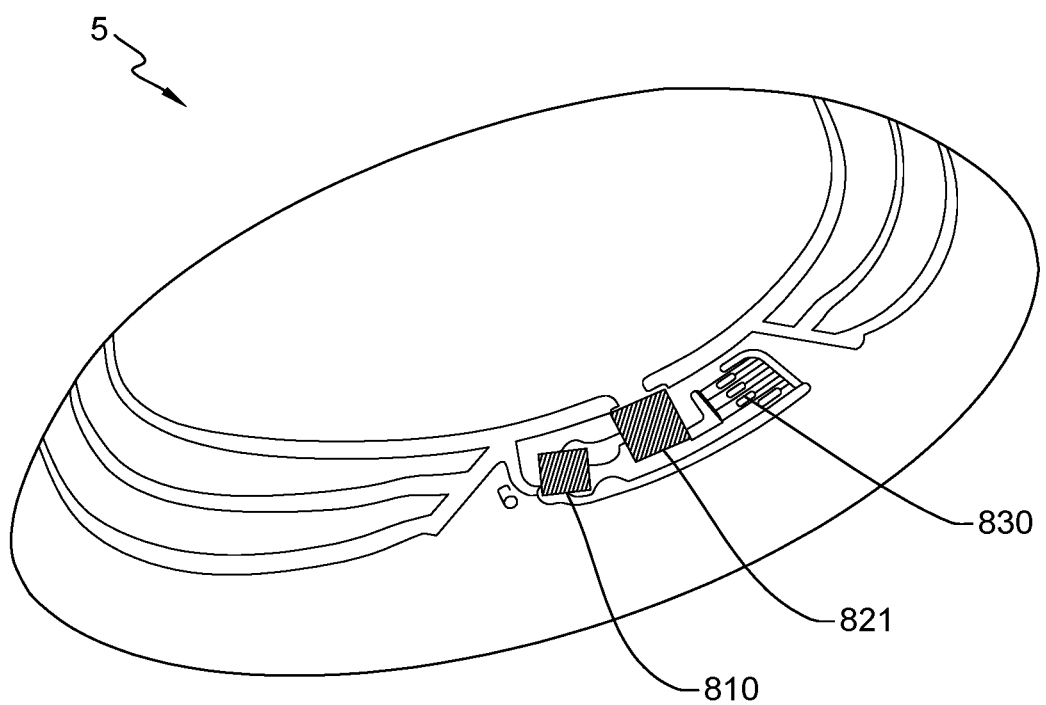
FIG. 8 is an illustration of a smart contact lens, according to an embodiment of the present invention.

FIG. 8 is an illustration of smart contact lens 5, according to an embodiment of the present invention. As depicted, FIG. 8 includes a single smart contact lens of a pair of smart contact lens 5. Smart contact lens 5 includes at least sensors 810, chip 821, and antenna 830. In some embodiments, smart contact lens 5 includes a thin, biocompatible, rechargeable battery (not depicted). In various embodiments, smart contact lens 5 are wearable computing devices. Smart contact lens 5 can include known smart contact lens capabilities and function. For example, sensors 810 can be one or more of NFC sensors, motion sensors, a compass chip, solar cells, retinal scanning devices, piezoelectric sensors, piezoresistive sensors, and any other suitable smart contact lenses sensors While depicted as one chip in FIG. 8, chip 821 may be one or more very thin, biocompatible chips. Chip 821 may include one or more computer processors. Chip 821 may receive data, process requests of a wearer of smart contact lens 5, send data, process received instructions, receive and/or convert received electrical energy from antenna 830 transmitted to smart contact lens 5 by antenna 12 in FIG. 1.

Antenna 830 can be one or more antennas for RF, NFC, or other wireless communication with antenna 12 and component 15 and other electronic devices (not depicted in FIG. 8). In various embodiments, antenna 830 is a coil-shaped antenna (e.g., for NFC). Antenna 830 provides an ability for wireless communication over a range of frequencies. Antenna 830 can be one or more antenna's capable of being embedded or formed in smart contact lens 5. In some examples, as depicted in FIG. 2, antenna 830 is formed with micro or nanowires embedded in smart contact lenses 5. In various embodiments, antenna 830 receives electrical energy generated by piezoelectric film 10 and sent to smart contact lens 5 by antenna 12 in FIG. 1.

Figure 9:
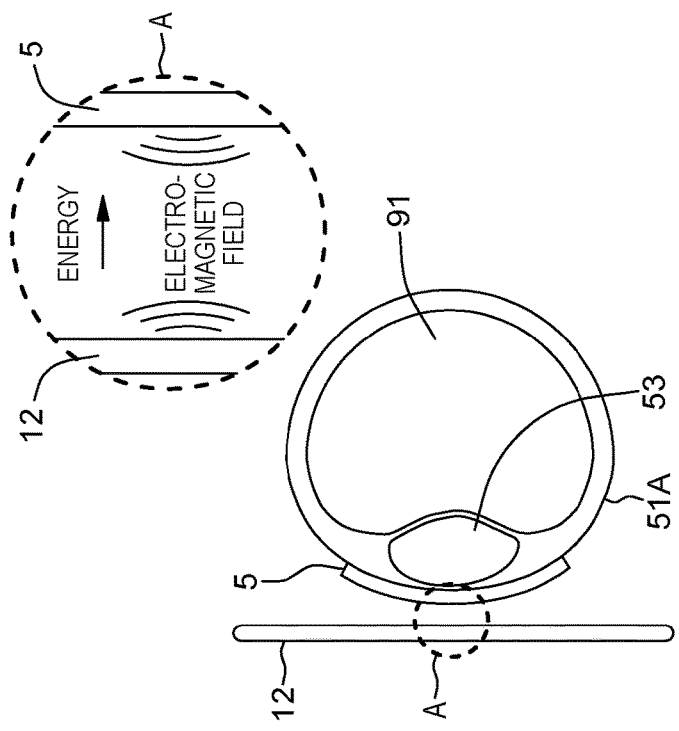
FIG. 9 is a schematic diagram depicting a cross-sectional view of the antenna transmitting energy to the smart contact lens, according to an embodiment of the present invention.

FIG. 9 is a schematic diagram depicting a cross-sectional view of antenna 12 transmitting energy to smart contact lens 5, according to an embodiment of the present invention. As depicted, FIG. 9 includes a cross-section of vitreous body 91 (e.g., commonly known as an eyeball), lens 53, sclera 51A with smart contact lens 5 and lens 53, and antenna 12 with a breakout A. Breakout A depicts a detail of the cross-section of antenna 12 and smart contact lens 5 that includes an illustration of electromagnetic field between smart contact lens 5 and antenna 12 that transmits the energy generated by piezoelectric film 10 in FIG. 1 to smart contact lens 5. In various embodiments, the transmission of the energy, generated by piezoelectric film 10 when the user blinks, occurs wirelessly (e.g., using NFC and the electromagnetic field 90).

Figure 10:
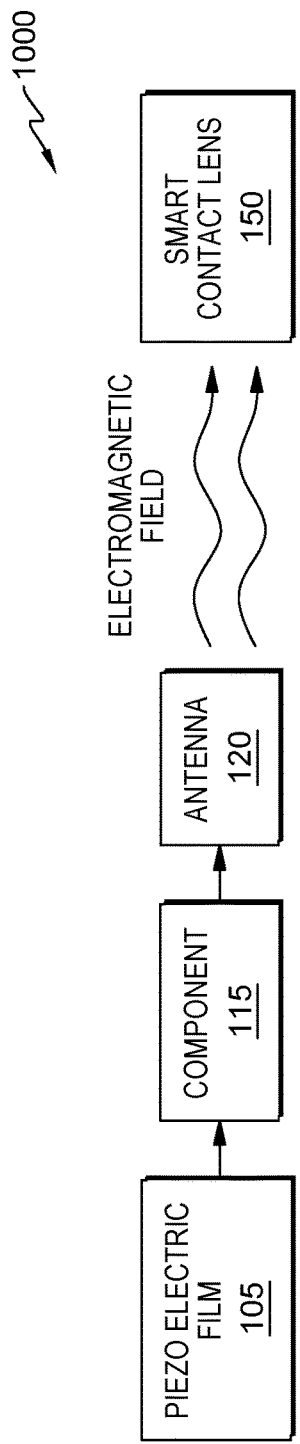
FIG. 10 is a block diagram depicting components of a method for transmitting energy generated by the piezoelectric film to the smart contact lens, according to an embodiment of the present invention.

FIG. 10 is a block diagram depicting components used in method 1000 of generating energy for smart contact lens 150, according to an embodiment of the present invention. As depicted, FIG. 10 includes piezoelectric film 105, component 115, antenna 120 and smart contact lens 150 in method 1000. In method 1000, piezoelectric film 105, component 115, antenna 120 and smart contact lens 120 provide essentially the same functionality and form as piezoelectric film 10, component 15, antenna 12 and smart contact lens 5 in FIG. 1.

In method 1000, after piezoelectric film 105 is attached to the eyelid of the user, piezoelectric film 105 generates electrical energy when the user, who is wearing smart contact lens 150, blinks. In method 1000, the energy generated by piezoelectric film 105 is transmitted to component 115 using a wired electrical connection. In some embodiments, upon receiving the electric energy generated by piezoelectric film 105, component 115, converts the energy to a form or signal suitable for wireless transmission. In method 1000, component 115 is directly connected (e.g., by a soldered connection of component 115 to antenna 120) to antenna 120. Antenna 120 wirelessly transmits the electric energy received from component 115 to smart contact lens 150.

In various embodiments, using known wireless energy transmission in method 1000, the wireless energy transmission of the electrical energy harvested by piezoelectric film 105 to smart contact lens 150 utilizes component 115 with a transmitter device, driven by electric power from piezoelectric film 105, that generates a time-varying electromagnetic field to transmit energy or power wirelessly across space to a receiver device in smart contact lens 150. The receiver device in smart contact lens 150 extracts energy from the field and supplies it to an electrical load. In method 1000, an antenna, such as antenna 830 (depicted in FIG. 8) in smart contact lens 150, can wirelessly receive the electrical energy generated by piezoelectric film 105. Smart contact lens 150 may then use the received electrical energy to drive one or more of processors in chip 821 or sensors 810 (depicted in FIG. 8) as smart contact lens 150 executes one or more functions.

In various embodiments, method 1000 is a continuous process that executes until the user removes either of smart contact lens 150 or piezoelectric film 105 from their eye or until the user falls asleep and is not generating electric energy with piezoelectric film 105 (e.g., the user is not blinking and therefore, is not generating any significant amount of electrical energy with piezoelectric film 105).

Figure 11:
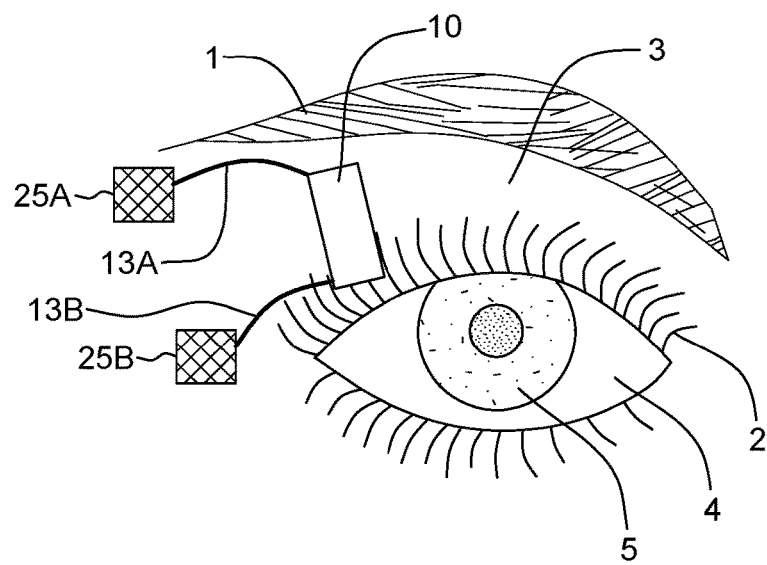
FIG. 11 depicts an illustration of the piezoelectric film on the eyelid connected to a component with an ultrasonic transducer, according to an embodiment of the present invention.

FIG. 11 depicts an illustration of piezoelectric film 10 on eyelid 3 connected to one of component 25A or component 25B with an ultrasonic transducer, according to an embodiment of the present invention. The elements depicted in FIG. 11 provide a method of generating electrical energy with piezoelectric film 10 when the user blinks eye 4 that is transmitted to smart contact lens 5 using an ultrasonic transducer included in component 25A and 25B. In FIG. 11, an antenna, such as antenna 12, is not used to transmit energy generated by piezoelectric film 10 to smart contact lens 5. Instead the components of FIG. 11 use ultrasonic waves traveling through the user's eyelid 3 and eye 4. In FIG. 11, component 25A and component 25B include an ultrasonic transducer directly attached to eyelid 3 of the user. For example, the back or bottom portion of component 25A and 25B may be directly attached to eyelid 3 by one of an adhesive layer or a gel layer. In some embodiments, component 25A and 25B include one or more elements of computer system 1300 depicted in FIG. 13.

As depicted, FIG. 11 includes eyebrow 1, eyelashes 2, eyelid 3, smart contact lens 5 in eye 4, piezoelectric film 10, wire 13A connected to component 25A, and wire 13B connected to component 25B. Except for components 25A and 25B, the elements of FIG. 10, such as eyebrow 1, eyelashes 2, eyelid 3, smart contact lens 5 in eye 4, and piezoelectric film 10 are essentially the same as eyebrow 1, eyelashes 2, eyelid 3, smart contact lens 5 in eye 4, and piezoelectric film 10 in FIG. 1. Wire 13A and wire 13B are essentially the same as wire 13 except for the location of wire 13A and wire 13B and the fact that wire 13A and 13B connect to components 25A and 25B, respectively.

In various embodiments, component 25A and 25B are electronic components capable of receiving electric energy generated by piezoelectric film 10 when the user blinks and using an ultrasonic transducer included in each of component 25A and 25B to ultrasonically send the generated electronic energy via the user's eyelid 3 and eye 4 to smart contact lens 5. Component 25A and 25B may include one or more microcontrollers, processors, drivers, or other electronic components along with an ultrasonic transducer or an ultrasonic transmitter. Components 25A and 25B may provide the circuits or functionality to convert a received voltage from wire 13A and wire 13B, respectively, generated by piezoelectric film 10 to an electrical signal or energy capable of being transmitted ultrasonically through the user's eyelid 3 and eye 4 to smart contact lens 5. In this example, at least one of sensors 810, depicted in FIG. 8 of smart contact lens 5, are an ultrasonic receiving device or ultrasonic receiver. The ultrasonic receiver in smart contact lens 5 may provide the received ultrasonic energy from the electrical energy to one or more of processors 821 in smart contact lens 5. In various embodiments, component 25A and 25B convert the electric energy (e.g., voltage) generated by piezoelectric film 10 to ultrasonic energy or waves and smart contact lens 5 using one or more of sensors 810 and chip 821 receive and convert ultrasonic energy into electrical energy. In one embodiment, smart contact lens 5 includes a capability for alternating current to direct current conversion (e.g., in processors 821).

FIG. 11 depicts component 25A and 25B as two components in two different locations connected to piezoelectric film 10 by wire 13A and 13B, respectively. In this example, both component 25A and 25B may receive electrical energy from piezoelectric film 10 by wire 13A and wire 13B, respectively. In some embodiments, only one of component 25A or component 25B are present and only one of wire 13A or wire 13B, respectively connects to piezoelectric film 10. In one embodiment, piezoelectric film 10 attaches on eyelid 3 directly above smart contact lens 5 and component 25A connects directly to piezoelectric film 10 (e.g., by conductive adhesive, solder or encapsulated wirebonds). In this example, component 25A may be either directly below eyebrow 1 or in the crease of eyelid 3 above lashes 2

Figure 12:
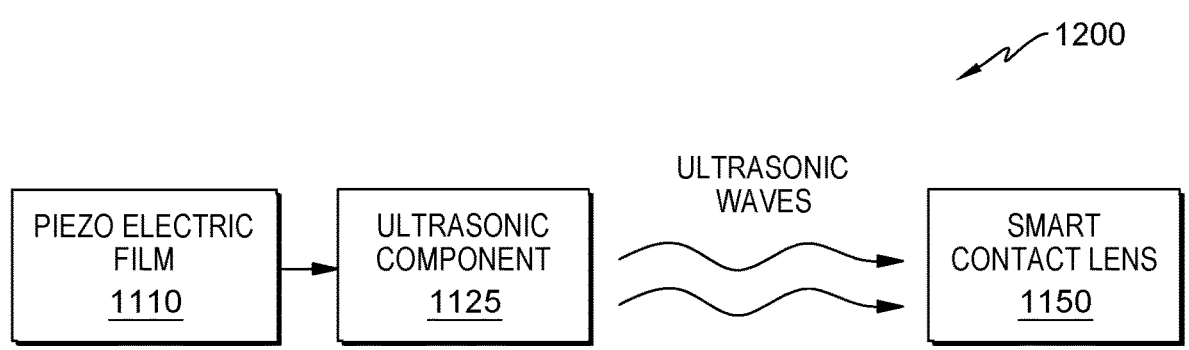
FIG. 12 is a block diagram depicting components of a method to transmitting energy generated by the piezoelectric device to the smart contact lens using ultrasonic transmission, according to an embodiment of the present invention.

FIG. 12 is a block diagram depicting components in method 1200 of ultrasonic component 1125 sending energy to smart contact lens 1150 using ultrasonic transmission, according to an embodiment of the present invention. The components piezoelectric film 1110, ultrasonic component 1125, and smart contact lens 1150 are essentially the same as piezoelectric film 10, component 25A, component 25B, and smart contact lens 5 with a similar or a same function as discussed above regarding FIG. 10.

In method 1200, piezoelectric film 1110 generates electrical energy, such as an electrical voltage, when the user blinks their eyes. Using a hard-wired connection, such as solder joints and a wire, connecting piezoelectric film 1110 to ultrasonic component 1125, the electrical energy generated by piezoelectric film 1110 is transmitted to ultrasonic component 1125. As previously discussed with respect to component 25A and 25B previously with respect to FIG. 11, ultrasonic component 1125 may convert alternating current to direct current and may use a driver, a microprocessor, or other circuit with an ultrasonic device, such as an ultrasonic transmitter. In method 1200, a known acoustic energy transfer (AET) method that uses ultrasonic component 1125 creating ultrasound waves or vibration to transmit energy generated by piezoelectric film 1110 to smart connect lens 1150. The acoustic energy transfer includes using a transducer device in ultrasonic component 1125 to generate and transmit the energy through living tissue in the user's eye area. The ultrasonic transmitter in ultrasonic component 1125 may send the energy using ultrasonic waves through the user's eyelid and eye to smart contact lens 1150. Smart contact lens 1150 may include an ultrasonic receiver as a sensor (e.g., one of sensors 810 in FIG. 8) to receive the energy transmitted by ultrasonic component 1125.

Method 1200 of harvesting mechanical energy when the user blinks using piezoelectric film 1110 and transmitting the energy to smart contact lens 1150 using an ultrasonic transducer or transmitter in ultrasonic component 1125 continues until the user falls asleep or removes piezoelectric film 1110 or smart contact lens 1150.

Figure 13:
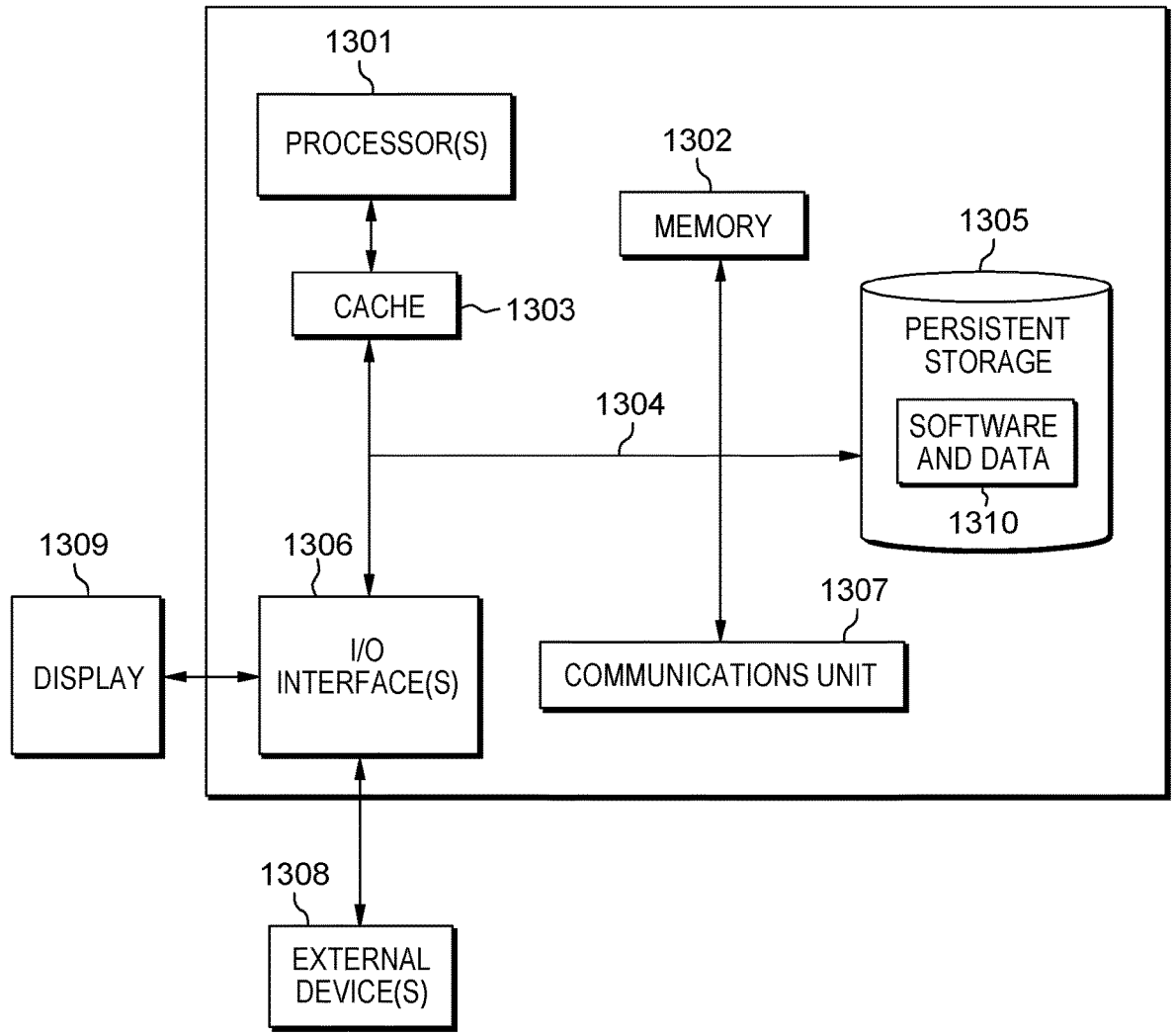
FIG. 13 is a block diagram depicting components of a computer system suitable for receiving and transmitting electric energy harvested by a piezoelectric film when a user wearing the piezoelectric film blinks, in accordance with at least one embodiment of the invention.

FIG. 13 is a block diagram depicting components of computer system 1300 suitable for receiving and transmitting electric energy harvested by a piezoelectric film when a user wearing the piezoelectric film blinks, in accordance with at least one embodiment of the invention. FIG. 13 depicts computer system 1300, which is representative of smart contact lens 5 and components 15, 25A and 25B, in accordance with an illustrative embodiment of the present invention. It should be appreciated that FIG. 13 provides only an illustration of one implementation and does not imply any limitations with regard to the environments in which different embodiments may be implemented. Some or all of the components of computer system 1300 of FIG. 13 are suitable for receiving and transmitting electric energy harvested by a piezoelectric film. Many modifications to the depicted environment may be made. The computer system of FIG. 13 includes processor(s) 1301, cache 1303, memory 1302, persistent storage 1305, communications unit 1307, input/output (I/O) interface(s) 1306, and communications unit 1307. Communications unit 1307 provides communications between cache 1303, memory 1302, persistent storage 1305, communications unit 1307, and input/output (I/O) interface(s) 1306. Communications unit 1307 can be implemented with any architecture designed for passing data and/or control information between processors (such as microprocessors, communications and network processors, etc.), system memory, peripheral devices, and any other hardware components within a system. For example, communications unit 1307 can be implemented with one or more buses or a crossbar switch.

Memory 1302 and persistent storage 1305 are computer readable storage media. In this embodiment, memory 1302 includes random access memory (RAM). In general, memory 1302 can include any suitable volatile or non-volatile computer readable storage media. Cache 1303 is a fast memory that enhances the performance of processor(s)

1301 by holding recently accessed data, and data near recently accessed data, from memory 1302.

Program instructions and data (e.g., software and data 1310) used to practice embodiments of the present invention may be stored in persistent storage 1305 and in memory 1302 for execution by one or more of the respective processor(s) 1301 via cache 1303. In an embodiment, persistent storage 1305 includes a magnetic hard disk drive. Alternatively, or in addition to a magnetic hard disk drive, persistent storage 1305 can include a solid state hard drive, a semiconductor storage device, a read-only memory (ROM), an erasable programmable read-only memory (EPROM), a flash memory, or any other computer readable storage media that is capable of storing program instructions or digital information.

The media used by persistent storage 1305 may also be removable. For example, a removable hard drive may be used for persistent storage 1305. Other examples include optical and magnetic disks, thumb drives, and smart cards that are inserted into a drive for transfer onto another computer readable storage medium that is also part of persistent storage 1305. Software and data 1310 can be stored in persistent storage 1305 for access and/or execution by one or more of the respective processor(s) 1301 via cache 1303.

Communications unit 1307, in these examples, provides for communications with other data processing systems or devices. In these examples, communications unit 1307 includes one or more network interface cards. Communications unit 1307 may provide communications through the use of either or both physical and wireless communications links using communication fabric 1304. Program instructions and data (e.g., software and data 1310) used to practice embodiments of the present invention may be downloaded to persistent storage 1305 through communications unit 1307.

I/O interface(s) 1306 allows for input and output of data with other devices that may be connected to each computer system. For example, I/O interface(s) 1306 may provide a connection to external device(s) 1308, such as a keyboard, a keypad, a touch screen, and/or some other suitable input device. External device(s) 1308 can also include portable computer readable storage media, such as, for example, thumb drives, portable optical or magnetic disks, and memory cards. Program instructions and data (e.g., software and data 1310) used to practice embodiments of the present invention can be stored on such portable computer readable storage media and can be loaded onto persistent storage 1305 via I/O interface(s) 1306. I/O interface(s) 1306 also connect to display 1309.

Display 1309 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute a resource entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein. Aspects of the present invention are described herein with reference to flowchart illustrations and/or block diagrams of methods and/or the various components of the apparatus according to embodiments of the invention.

What is claimed is:

1. An apparatus for harvesting electrical energy from a user blinking, the apparatus comprising:
    a piezoelectric film attaching directly to an eyelid of a user generating electrical energy;
    a wire connecting the piezoelectric film to an electronic component attaching directly to the eyelid of the user, the electronic component attaching directly to a corner of an eye of the user; and
    an antenna attaching directly to at least a portion of the eyelid of the user connecting to the electronic component, wherein the antenna is adapted to wirelessly transmit the generated electrical energy to a smart contact lens worn by the user, wherein the smart contact lens receives wirelessly transmitted electrical energy from the antenna, and the antenna surrounds the eye of the user.

2. The apparatus of claim 1, wherein the piezoelectric film generates electrical energy from a movement of the piezoelectric film when the user blinks.

3. The apparatus of claim 2, wherein the movement of the piezoelectric film when the user blinks induces a strain in the piezoelectric film to generate the electrical energy in the piezoelectric film.

4. The apparatus of claim 2, wherein the electronic component provides an ability to wirelessly transmit the electrical energy generated from the movement of the piezoelectric film when the user blinks to a smart contact lens worn by the user.

5. The apparatus of claim 1, wherein a connection connects the wire to (i) the piezoelectric film and (ii) the electronic component, the connection selected from the group consisting of: a solder joint, a gold-to-gold joint, a wirebond, a braze, and a conductive adhesive.

6. The apparatus of claim 1, wherein the electronic component is a microelectromechanical system.

7. The apparatus of claim 1, wherein the electronic component includes a wireless transmitter.

8. The apparatus of claim 1, wherein the antenna is directly on the eyelid and surrounds an eye of the user.

9. An apparatus for harvesting electrical energy from a user blinking, the apparatus comprising:
    two or more separate piezoelectric films attaching directly to an eyelid of a user generating electrical energy;
    two or more wires attaching directly to the eyelid of the user connecting the piezoelectric films to an electronic component attaching directly to the eyelid of the user, the electronic component attaching directly to a corner of an eye of the user; and
    a smart contact lens in an eye of the user, wherein the smart contact lens receives the generated electrical energy ultrasonically from the electronic component, wherein the smart contact lens receives wirelessly transmitted electrical energy from an antenna, and wherein the antenna surrounds the eye of the user.

10. The apparatus of claim 9, wherein the piezoelectric film attaching directly to the eyelid of the user generates electrical energy from a movement of the piezoelectric film when the user blinks.

11. The apparatus of claim 9, wherein the electronic component provides an ability to send the electrical energy, generated from the movement of the piezoelectric film when the user blinks, ultrasonically to the smart contact lens.

12. The apparatus of claim 11, wherein the electronic component includes an ultrasonic transmitter.

13. The apparatus of claim 12, wherein the electronic component is a microelectromechanical system.

14. The apparatus of claim 9, wherein the electronic component is in direct contact with the user's eyelid to send ultrasonic waves through the eyelid of the user and an eye of the user to a sensor in a smart contact lens worn by the user.

15. The apparatus of claim 14, wherein the electrical component uses the ultrasonic waves to send electrical energy captured by the piezoelectric film when the user blinks to the smart contact lens.

\* \* \* \* \*